United States Patent
Ravi

(10) Patent No.: US 7,926,019 B1
(45) Date of Patent: Apr. 12, 2011

(54) COMMON CLOCK PATH PESSIMISM ANALYSIS FOR CIRCUIT DESIGNS USING CLOCK TREE NETWORKS

(75) Inventor: Ajay K. Ravi, San Jose, CA (US)

(73) Assignee: Altera Corporation, San Jose, CA (US)

( * ) Notice: Subject to any disclaimer, the term of this patent is extended or adjusted under 35 U.S.C. 154(b) by 490 days.

(21) Appl. No.: 12/039,918

(22) Filed: Feb. 29, 2008

(51) Int. Cl.
*G06F 9/455* (2006.01)
*G06F 17/50* (2006.01)

(52) U.S. Cl. ........................ 716/134; 716/108

(58) Field of Classification Search .............. 716/108, 716/134
See application file for complete search history.

(56) References Cited

U.S. PATENT DOCUMENTS

| | | | | |
|---|---|---|---|---|
| 5,636,372 A * | 6/1997 | Hathaway et al. | ........... | 713/500 |
| 7,406,669 B2 * | 7/2008 | Lindberg | .................. | 716/3 |
| 7,694,254 B2 * | 4/2010 | Gregerson et al. | ............. | 716/6 |
| 2005/0066297 A1 * | 3/2005 | Kalafala et al. | .................. | 716/6 |
| 2005/0183051 A1 * | 8/2005 | Darsow et al. | .................... | 716/6 |
| 2005/0278672 A1 * | 12/2005 | Hosono et al. | .................... | 716/6 |
| 2006/0248485 A1 * | 11/2006 | Foreman et al. | .................. | 716/6 |
| 2007/0022397 A1 * | 1/2007 | Darsow et al. | .................... | 716/6 |
| 2008/0163147 A1 * | 7/2008 | Gregerson et al. | ............... | 716/6 |
| 2008/0168412 A1 * | 7/2008 | Cheon et al. | ...................... | 716/7 |

* cited by examiner

*Primary Examiner* — Stacy A Whitmore
(74) *Attorney, Agent, or Firm* — Martine Penilla & Gencarella, LLP

(57) ABSTRACT

Method, computer program and system to perform timing analysis of designs containing clock networks by eliminating Common Clock Path Pessimism. The method includes transforming a clock network into a clock tree that includes nodes with different clock signal arrival times and leaf nodes representing source and destination registers. The tree is populated with information regarding the source and destination registers and the associated timing for the clock arrival signal. The method then enumerates Common Clock Path Pessimism (CCPP) groups, where any source register and any destination register in a CCPP group have the same nearest common ancestor node in the clock tree. The creation of CCPP groups enables analysis time reduction because only one timing calculation is required for the CCPP group instead of having to perform the analysis for each possible pair of registers. The method eliminates CCPP for each CCPP group and then displays the results.

20 Claims, 11 Drawing Sheets

COMMON CLOCK PATH PESSIMISM ANALYSIS FOR CIRCUIT DESIGNS USING CLOCK TREE NETWORKS

BACKGROUND

Conventional static timing analysis of circuit designs is done under the assumption that the delay values of circuit components are fixed at the PVT (Process, Voltage, Temperature) timing corner under consideration. However, this assumption is not correct in certain types of circuit analysis, such as analysis for deep submicron technologies. The delays of each component can vary over the die itself. For example, a component in one corner of a die may have a different delay than the same component in another corner of the die. There are delay variations across the wafer, across different wafer lots, variations due to supply voltage fluctuations across the die, etc. All of these delay variations are collectively referred to as On Chip Variation (OCV) or On Die Variation (ODV).

A simple way of incorporating these delay variations into conventional timing analysis methods is to assume (for a given timing corner) worst case delays for max paths and best case delays for the min paths. This can lead to too much pessimism because the analysis includes some delay components that have both worst-case and best-case delays at the same time.

Most of this pessimism is due to common clock paths feeding both source and destination registers of timing paths. This type of pessimism is called Common Clock Path Pessimism (CCPP) or Clock Re-convergence Pessimism (CRP). Removing or minimizing this pessimism from timing analysis is referred to as CCPP removal or CRP Removal (CRPR). CCPP removal is a hard problem in general for arbitrary clock networks. Methods to solve this problem can take an amount of time that grows exponentially with the size of the clock network.

It is in this context that embodiments of the invention arise.

SUMMARY

Embodiments of the present invention provide method, computer program and system to perform timing analysis of designs containing clock networks by eliminating Common Clock Path Pessimism. The method uses a clock tree to create CCPP group, where each CCPP group have source registers, destination registers, and a common tree node. The common node represents the nearest common point in the circuit for the path of the clock signal arriving to the registers in the CCPP group. The CCPP can be eliminated for the clock arrival signal travelling to the CCPP node because it is common to all the registers in the CCPP group.

In one embodiment, a method to eliminate CCPP in a circuit design transforms a clock network into a clock tree that includes nodes with different clock signal arrival times and leaf nodes representing source and destination registers. The tree is populated with information regarding the source and destination registers and the associated timing for the clock arrival signal to the different nodes and registers. The method then enumerates Common Clock Path Pessimism (CCPP) groups, where any source register and any destination register in a CCPP group have the same nearest common ancestor node in the clock tree. The creation of CCPP groups enables analysis time reduction because only one timing calculation is required for the CCPP group instead of having to perform the analysis for each possible pair of registers. The method eliminates CCPP for each CCPP group and then displays the results.

It should be appreciated that the present invention can be implemented in numerous ways, such as a process, an apparatus, a system, a device or a method on a computer readable medium. Several inventive embodiments of the present invention are described below.

Other aspects of the invention will become apparent from the following detailed description, taken in conjunction with the accompanying drawings, illustrating by way of example the principles of the invention.

BRIEF DESCRIPTION OF THE DRAWINGS

The invention may best be understood by reference to the following description taken in conjunction with the accompanying drawings in which.

DETAILED DESCRIPTION

The following embodiments describe a method and apparatus to perform timing analysis of circuit designs containing clock networks to eliminate Common Clock Path Pessimism. The method includes transforming a clock network into a clock tree that includes nodes with different clock signal arrival times and leaf nodes representing source and destination registers. The method uses the clock tree to enumerate Common Dock Path Pessimism (CCPP) groups, where any source register and any destination register in a CCPP group have the same nearest common ancestor node in the clock tree. The creation of CCPP groups enables analysis time reduction because only one timing calculation is required for the CCPP group instead of performing analysis for each possible pair of source and destination registers. The method eliminates CCPP for each CCPP group and then displays the results.

It will be obvious, however, to one skilled in the art, that the present invention may be practiced without some or all of these specific details. In other instances, well known process operations have not been described in detail in order not to unnecessarily obscure the present invention.

Figure 1:
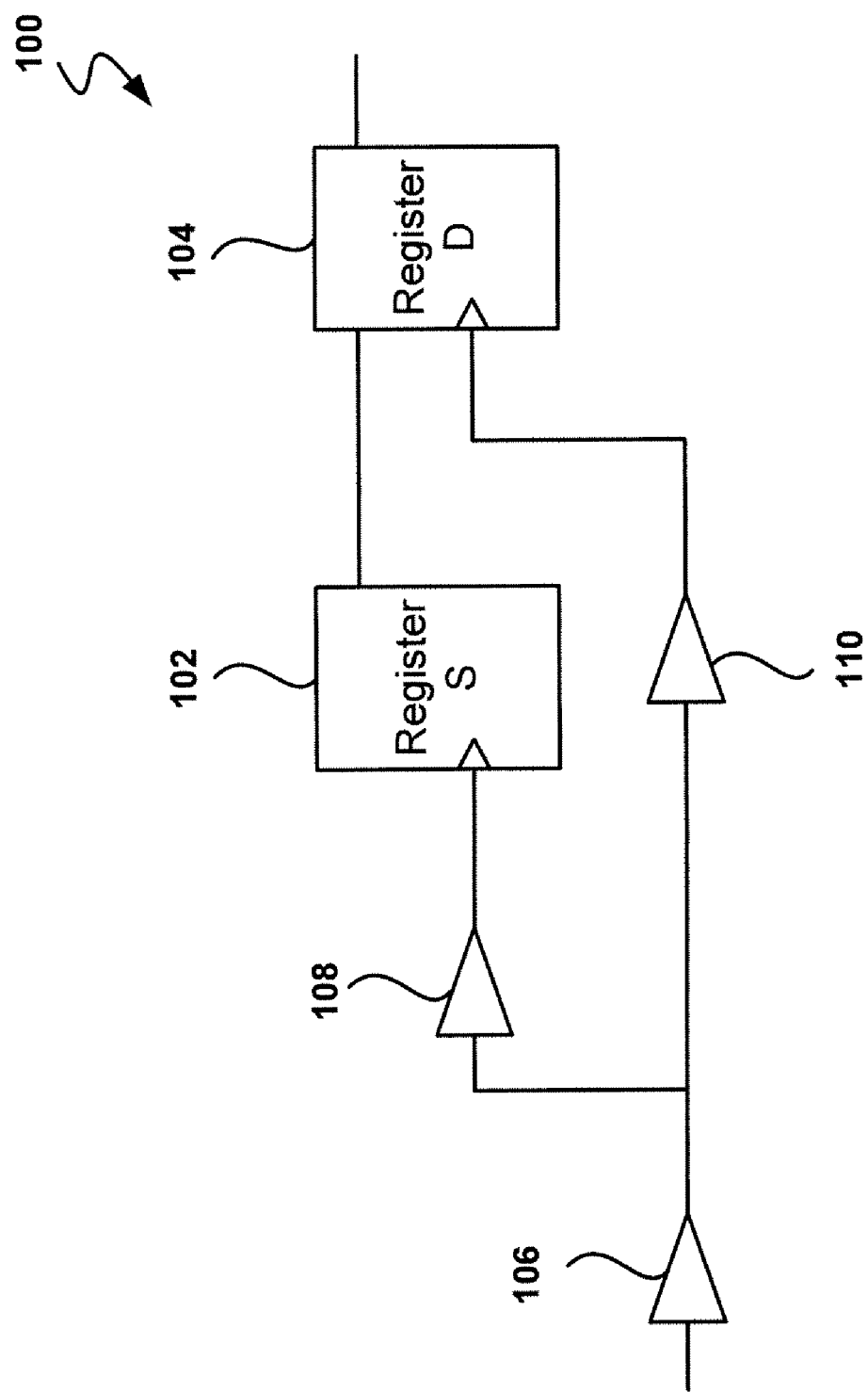
FIG. 1 depicts a circuit with different clock-signal arrival times.

FIG. 1 depicts a circuit with different clock-signal arrival times. FIG. 1 shows at a high level the problem of timing analysis related to delays associated with the clock signal. In circuit 100, registers 102 and 104 receive the clock signal via buffers 106, 108 and 110. The data output of register 102 is the input for register 104, that is, register 102 is a source register and register 104 is a destination register. The clock signal arriving at register 102 travels through buffers 106 and 108, while the clock signal arriving at register 104 travels through buffers 106 and 110. The clock signal is the same until the output of buffer 106 and then the signal takes different paths. The delays in buffers 107 and 110 can be different causing the clock signals arriving at registers 102 and 104 to be different.

When calculating the difference in arrival times to registers 102 and 104, the delays taking place before the output of buffer 106 can be discounted because the delays are common to both clock signals arriving at registers 102 and 104. One of the results of the timing analysis is the maximum frequency for the circuit, $f_{MAX}$. For example, an initial calculation may give an $f_{MAX}$ of 100 MHz, and removing the pessimism using CCPP can give an $f_{MAX}$ of 105 MHz. Sometimes, a circuit designer will estimate an initial $f_{MAX}$, such as 90 MHz, and the analysis tool will produce a number indicating how much faster the circuit can operate at. This number is called the slack, and the slack can be positive or negative.

Clock networks can be classified based on their topology and the resulting graphical representation. Graph nodes represent clock drivers or sinks, and graph edges represent connections (or nets). The clock networks can be classified into three different categories:

1. Tree networks, where the graphical representation is a tree
2. Directed Acyclic Graph (DAG) networks, where the graphical representation is a DAG. DAG networks include tree networks, since a tree is also a DAG.
3. General networks, which includes all other kinds of networks including tree and DAG networks.

Most of the simpler DAG networks can be converted to equivalent tree networks, with little loss of accuracy. Therefore the proposed method based on clock trees can also be used for analyzing DAG networks.

Definitions of different terms used to describe embodiments of the invention follow. A clock tree is a tree of nodes where the root node represents the clock source. The root is at level 0 and is the top-most node. A node at level L is said to have a depth of L. Internal nodes are clock nodes, and leaf nodes are clock pins on registers, that is, a register is synonymous with a leaf node. NCA(n1, n2) is the Nearest Common Ancestor of nodes n1 and n2, meaning that there is no other node descending from NCA(n1, n2) node that also has both n1 and n2 as descendents.

A source register is a register that has at least one timing path from itself to another register. A destination register is a register that has at least one timing path arriving from another register. A register can be both a source register and a destination register. Additionally, a register can feed back to itself.

Figure 2:
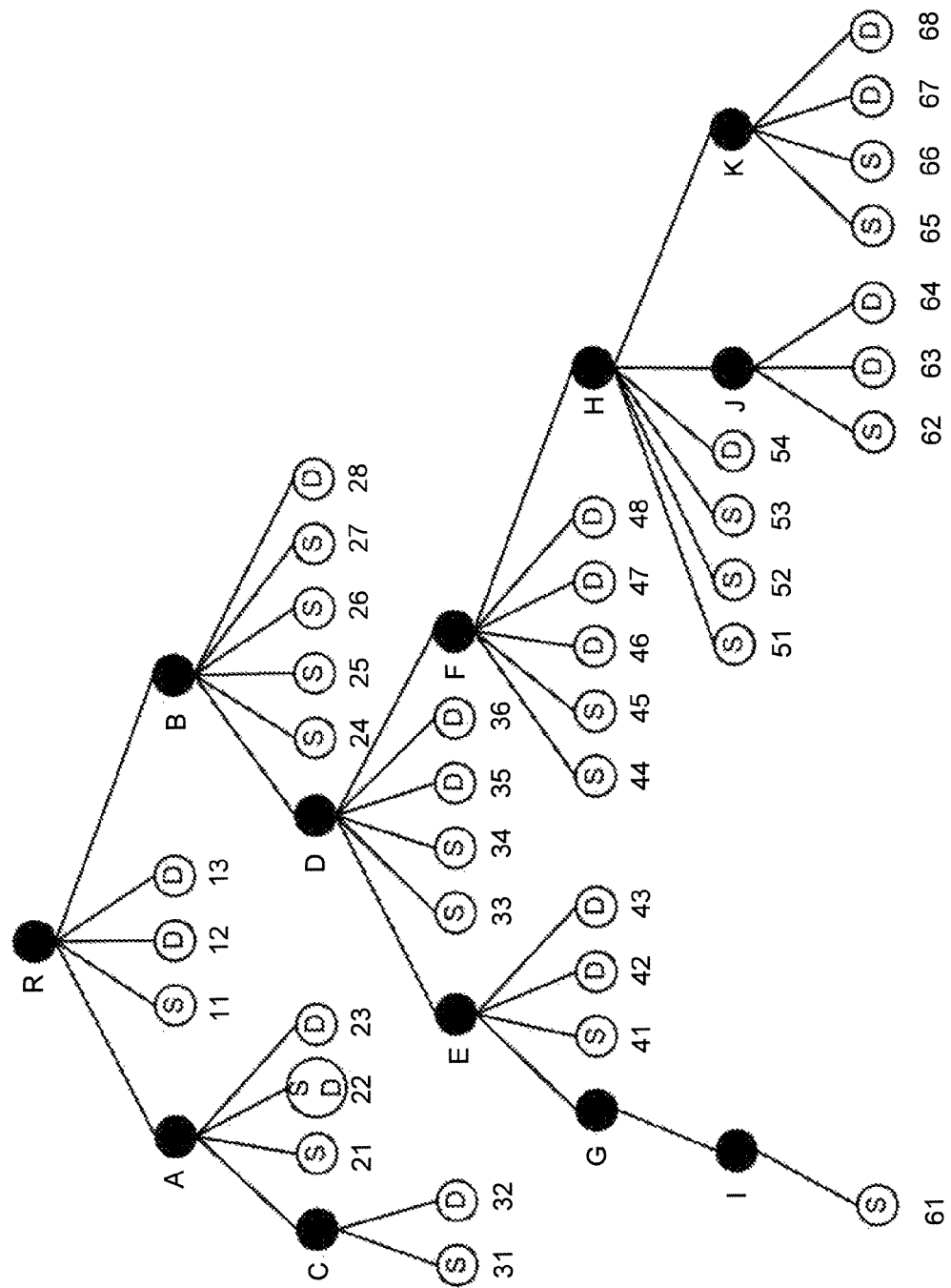
FIG. 2 describes a sample clock tree network according to one embodiment of the invention.

FIG. 2 describes a sample clock tree network according to one embodiment of the invention. The clock nodes, R and A-K, are represented by a black circle. Registers are represented by white circles. In this embodiment, the registers are of three kinds: Source registers (S), Destination registers (D), and Registers that feed onto themselves (SD).

A CCPP group consists of a set of source registers S, a set of destination registers D, and a CCPP clock node such that the CCPP clock node is the Nearest Common Ancestor in the clock tree between any source register in S and any destination register in D. Delays from the CCPP clock node to each register in the CCPP group are available in constant time, and only a subset of all the register-to-register paths between S and D may actually exist in the circuit design.

Source Register Group (SRG) of a clock node n, SRG(n), is the subset of all children of n that are source registers. Destination Register Group (DRG) of a clock node n, DRG (n), is the subset of all children of n that are destination registers. Therefore, each clock node n has a SRG(n) and a DRG(n).

All Source Registers (ASR) under a node n, ASR(n), is the set of all source registers contained in the subtree rooted at n, or in other words, the set of all source registers descending from n. Thus, by definition, ASR(n) includes SRG(n). Similarly, All Destination Registers (ADR) under a node n, ADR (n), is the set of all destination registers in the subtree rooted at n.

The delay of the clock signal between node n1 and its descendent n2 is denoted as d(n1, n2). The clock arrival time of a tree node n, arrival(n), is equal to the delay between the root and node n, that is, arrival(n)=d(root, n).

Figure 3:
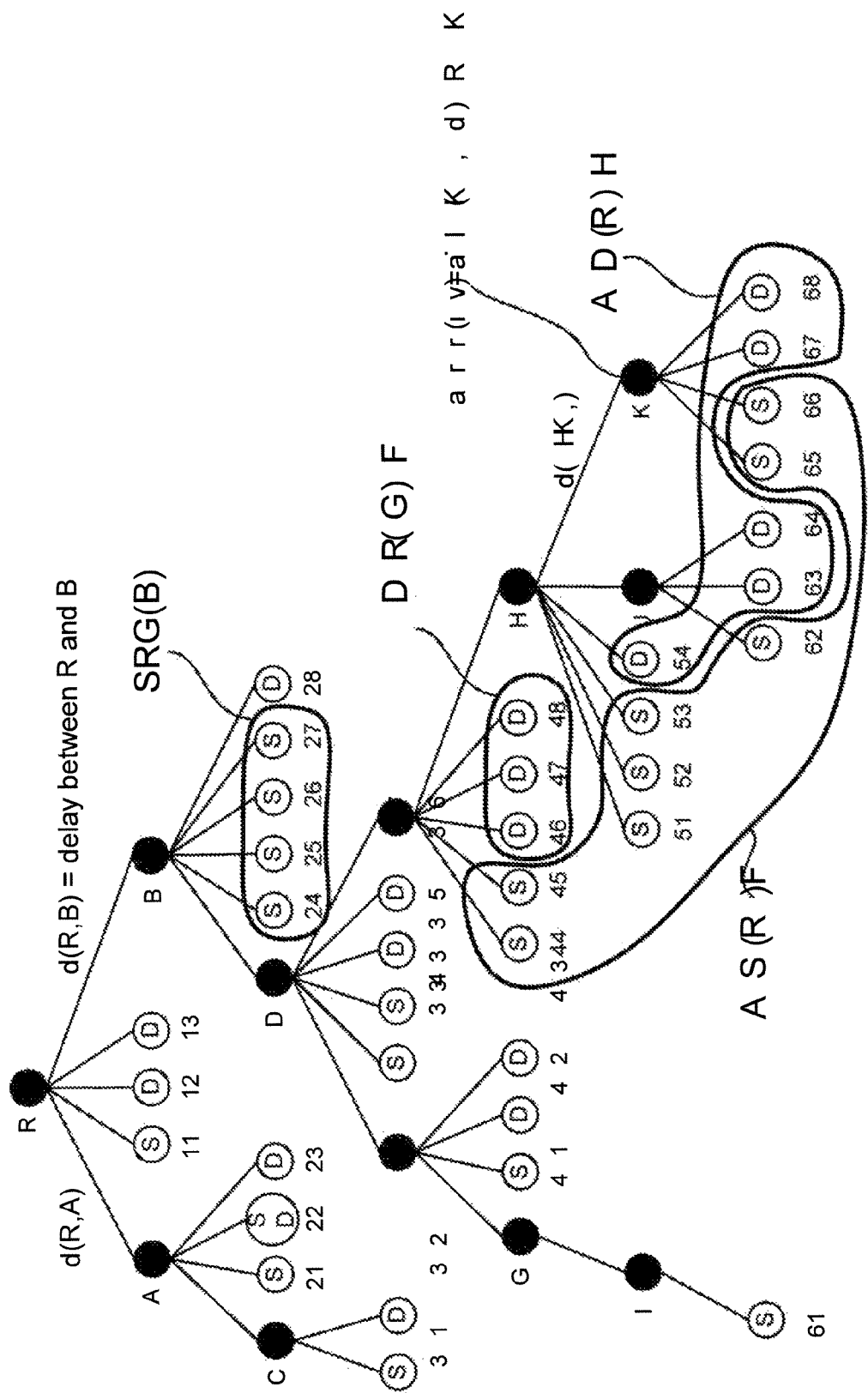
FIG. 3 shows register group definitions pictorially according to one embodiment.

FIG. 3 shows register group definitions pictorially according to one embodiment. Highlighted in the tree are the following examples for the different groups of nodes:

SRG(B), source registers 24-27, including all source registers that are direct children of node B.
DRG(F), destination registers 46-48, including all destination registers that are direct children of node F.
ASR(F), source registers 44, 45, 51-53, 62, 65, and 66, including all source registers descending from node F.
ADR(H), destination registers 54, 63, 64, 67, and 68, including all destination registers descending from node H.

Existing methods to account for CCPP over all the paths in a clock tree network require processing time in the order of O(N*N), where N is the number of registers. This requires traversing the network N times, once for each destination or source register. In one embodiment, a small number of CCPP groups are enumerated. The number of CCPP groups listed is directly related to the number of internal nodes in the equivalent clock tree for the given clock network. The enumeration of CCPP groups enables new approaches to the CCPP removal problem. In one embodiment, each CCPP group is analyzed using conventional methods, that is, the netlist is traversed only once per CCPP group.

In one embodiment of the invention, a method includes three high-level operations: Tree transformation, register attribute population, and CCP group computation. In the first operation, tree transformation, an equivalent version of the clock tree is created, and it is described below with respect to FIGS. 4-6.

Figure 4:
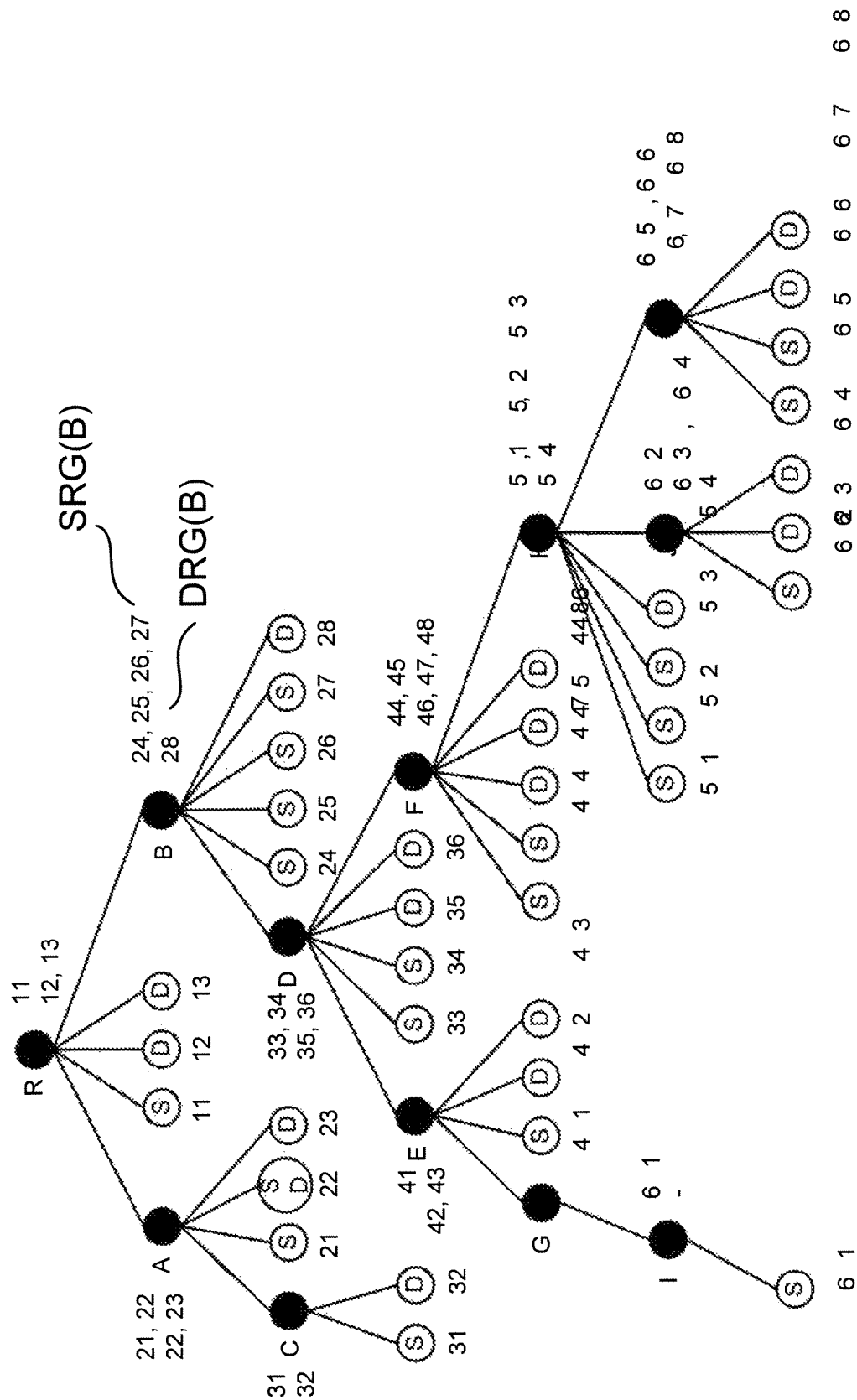
FIG. 4 shows the creation of Source Register Groups (SRG) and Destination Register Groups (DRG).

FIG. 4 shows the creation of Source Register Groups (SRG) and Destination Register Groups (DRG). This is the first operation in the tree transformation process. Each register contains three elements: register identification, register type (source only, destination only, or both), and arrival time (not shown). In FIG. 4, the SRG and DRG for each clock node are listed next to the clock node. Highlighted are SRG(B) with nodes 24-27, and the DRG(B) with node 28. The execution time of the operation is linearly proportional to the number of registers.

The operation to compute the SRG and DRG groups for each node is described in pseudo-language as follows:

Foreach register reg in design {
c=parent clock node of reg
if reg is a source register then add reg to c.srg
if reg is a destination register then add reg to c.drg
}

The second operation in the tree transformation process includes computing the arrival times from the root node to all nodes and leafs, and storing the arrival times as attributes on the nodes. The execution time of the second operation is linearly proportional to the number of nodes and leafs because the operation includes a single pass from root to leaves.

Figure 5:
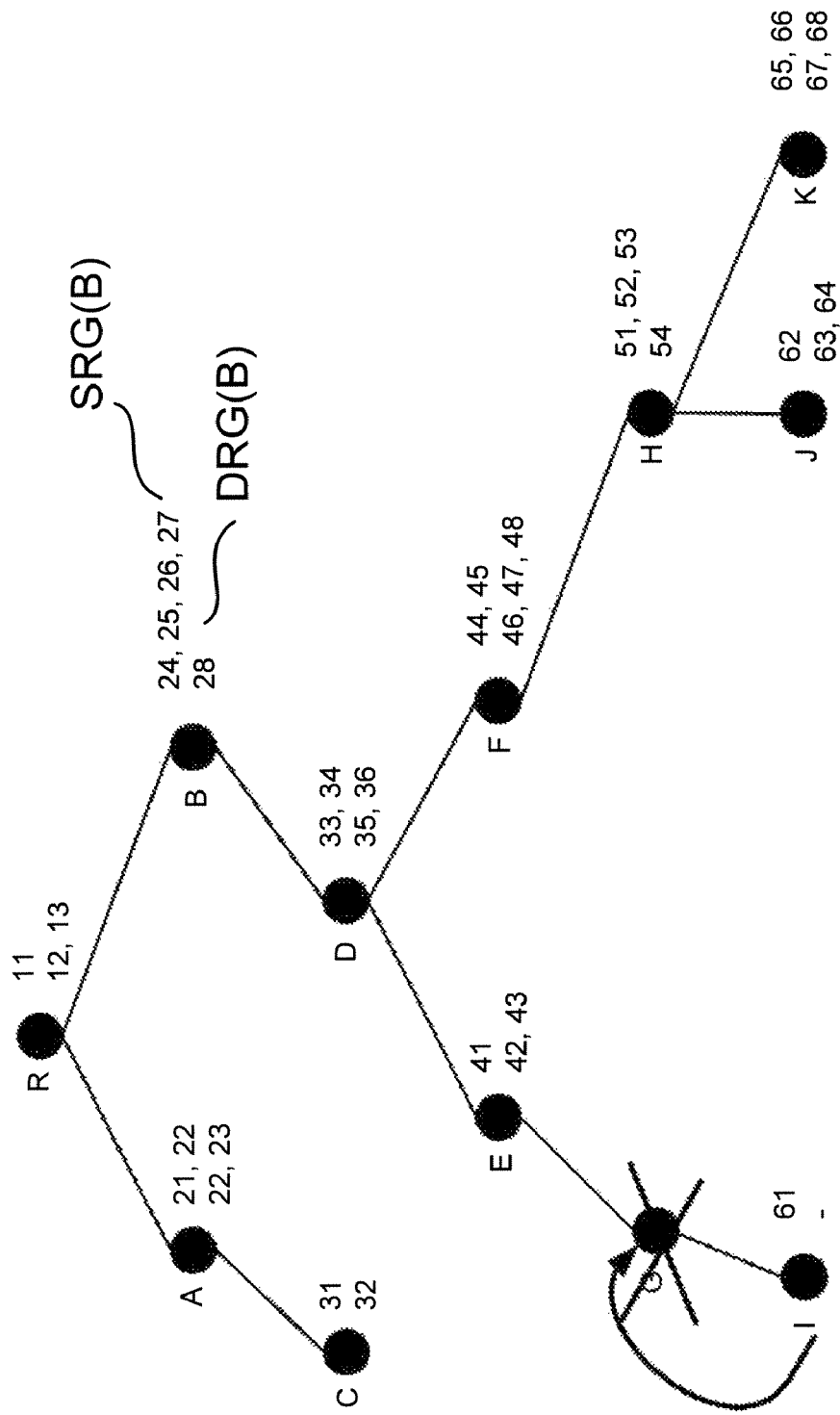
FIG. 5 depicts the elimination of nodes that have no registers directly attached.

The third operation in the tree transformation process is the elimination of clock nodes with empty source and destination register groups. These nodes are replaced by their children. FIG. 5 depicts the elimination of nodes that have no registers directly attached. Node G has empty SRG and DRG groups and G is replaced by its only child, node I.

Figure 6:
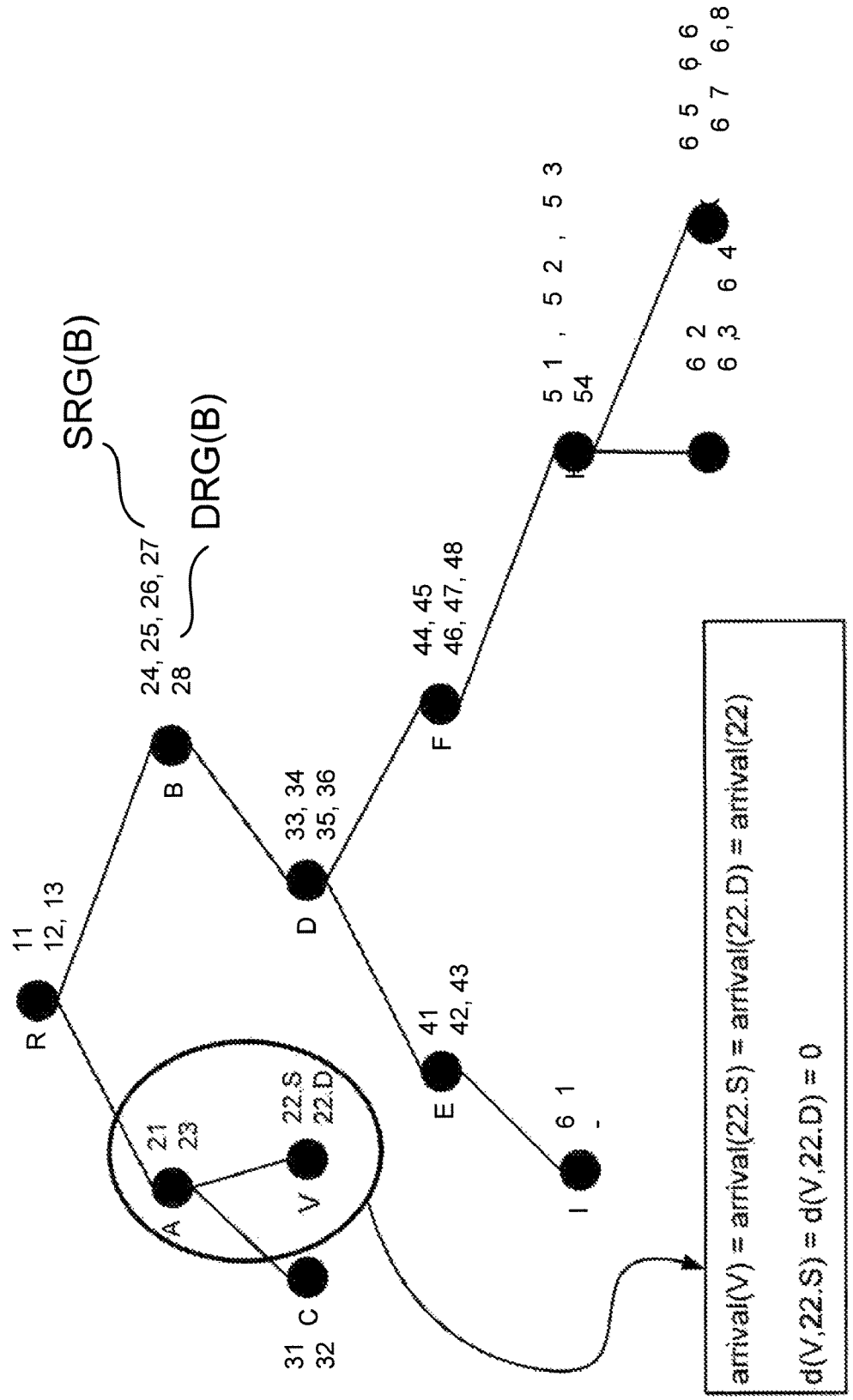
FIG. 6 describes the conversion performed to analyze registers that feed back to themselves according to one embodiment.

The fourth operation of the tree transformation phase is the creation of virtual clock nodes for registers that feed back to themselves. FIG. 6 describes the conversion performed to analyze registers that feed back to themselves according to one embodiment. In this example, node 22 feeds back to itself. For each register that feeds back to itself, the following operations are performed:

- Create a new clock node under the parent of the register feeding to itself. In this example, new node V is created under node A.
- Create a new source register and a new destination register as children of the new node. In this example 22.S and 22.D are created under V.
- Populate SRG and DRG of the new node with the newly created registers. In the example, SRG(V)=22.S, and DRG(V)=22.D.
- Set new arrival times and delays for the new clock node and registers: arrival(new node)=arrival(original register feeding to itself); arrival(new destination register)=arrival(new source register)=arrival(original register feeding to itself; and d(new node, new registers)=0. In our case, arrival(V)=arrival(22.S)=arrival(22.D)=arrival(22), and d(V, 22.S)=d(V, 22.D)=0.

After the tree transformation operations, all clock nodes have non-empty source or destination register groups, and every register feeding itself gets a new clock node. Additionally, all leaves in the original tree can be removed, since leaves are now represented as register group attributes on their parent node. All the tree nodes have now delays and arrival times associated with them (not shown), and the registers have been identified as 'source' or 'destination' registers. The execution time for the tree transformation operations is in the order of N, O(N), where N is the number of nodes in the original clock tree.

Figure 7:
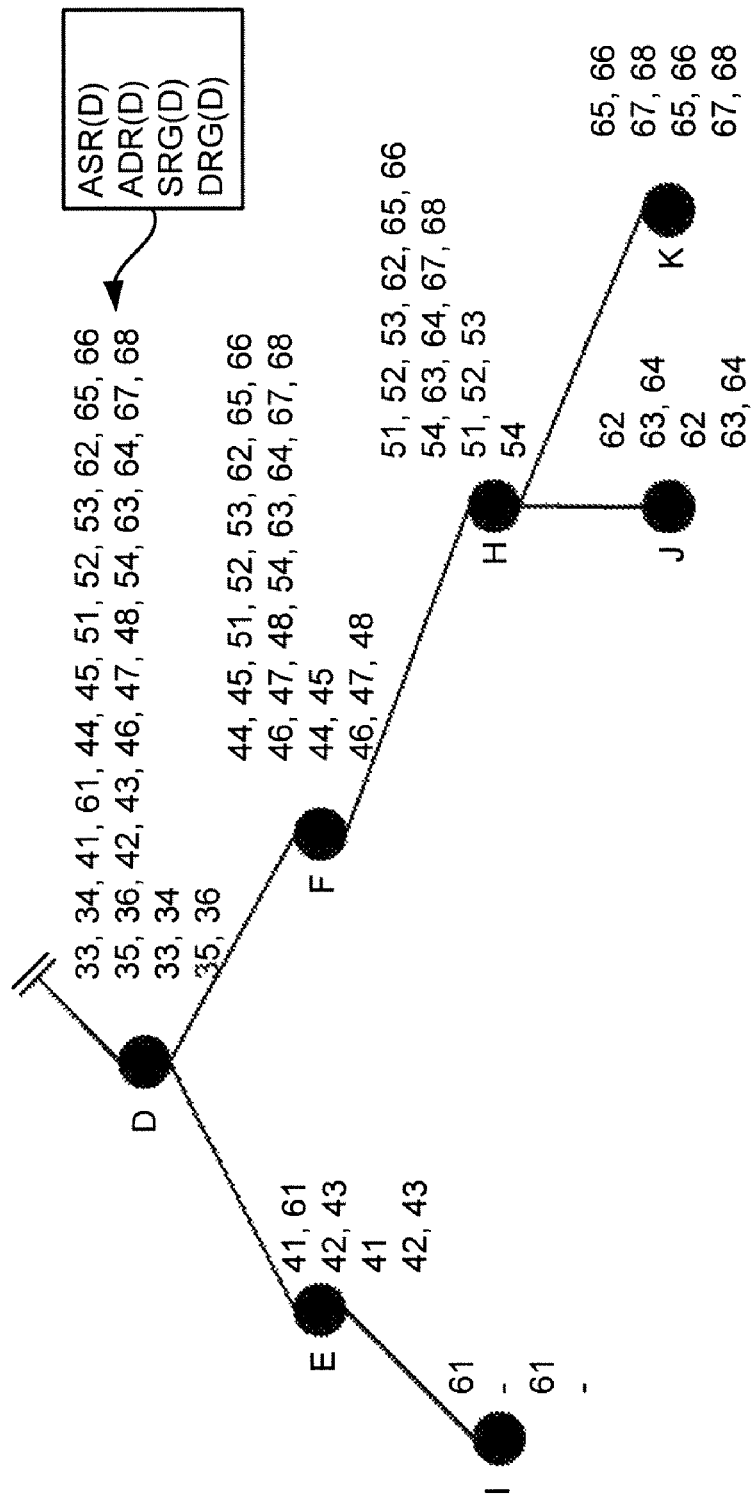
FIG. 7 shows the computation of All Source Registers (ASR) and All Destination Registers (ADR) for the nodes in the clock tree in one embodiment of the invention.

The next phase includes the population of register attributes in the tree. FIG. 7 shows the computation of All Source Registers (ASR) and All Destination Registers (ADR) for the nodes in the clock tree in one embodiment of the invention. Only the subtree rooted at node D is shown for clarity, but the same principle applies to the rest of the tree. Initially, each node initializes its ASR and ADR with the existing SRG and DRG groups in the node. Then each node adds to its ASR and ADR the ASRs and ADRs of its children clock nodes. Using pseudo code, a recursive routine to achieve this operation in one embodiment can be described as follows:

```
Vist(node n) {
  Foreach child c of n {
    ASR(c)=Visit(c)
    Add ASR(c) to ASR(n)
  }
  Return ASR(n)
}
```

In one embodiment, the node groups are described using linked lists, that is, SRG(n) is a pointer to the list of registers in the SRG, and DRG(n) is a pointer to the list of registers of DRG of node n. ASR(n) and ADR(n) are implemented using two pointers each: a head pointer and a tail pointer. The head pointer points to the first element in the linked list, and the tail pointer points to the last element in the linked list. There are execution advantages by using lists and pointers to implement the above pseudo code, as described below. In another embodiment, the register groups are implemented using arrays.

The pseudo-language routine to calculate ASR and ADR using linked lists is as follows:

```
Visit(n) {
  asr_head=asr_tail=NULL
  Foreach child c in n {
    (c_head, c_tail)=Visit (c)
    if asr_head is NULL then asr_head=c_head
    else asr_tail->next=c_head
    asr_tail=c_tail
  }
  //n.sn is SRG(n), previously computed in the tree transformation phase
  n.sn->next=asr_head, asr_head=n.sn//insert SRG(n) into ASR(n)
  n.asr=(asr_head, asr_tail)//store ASR(n) as attribute on n.
  return (asr_head, asr_tail)
}
```

Using the two pointer representation for ASR and ADR enables a linear execution time and requires a linear amount of memory for populating register attributes. The execution time of this phase is in the order of the number of tree nodes, O(N).

In the third phase, the CCPP groups are identified by traversing the clock tree. Two possible ways to traverse the tree are described, but other traversal methods can be applied to enumerate all the CCPP groups. The two traversal methods are the linear method and the N*LogN method.

Figure 8:
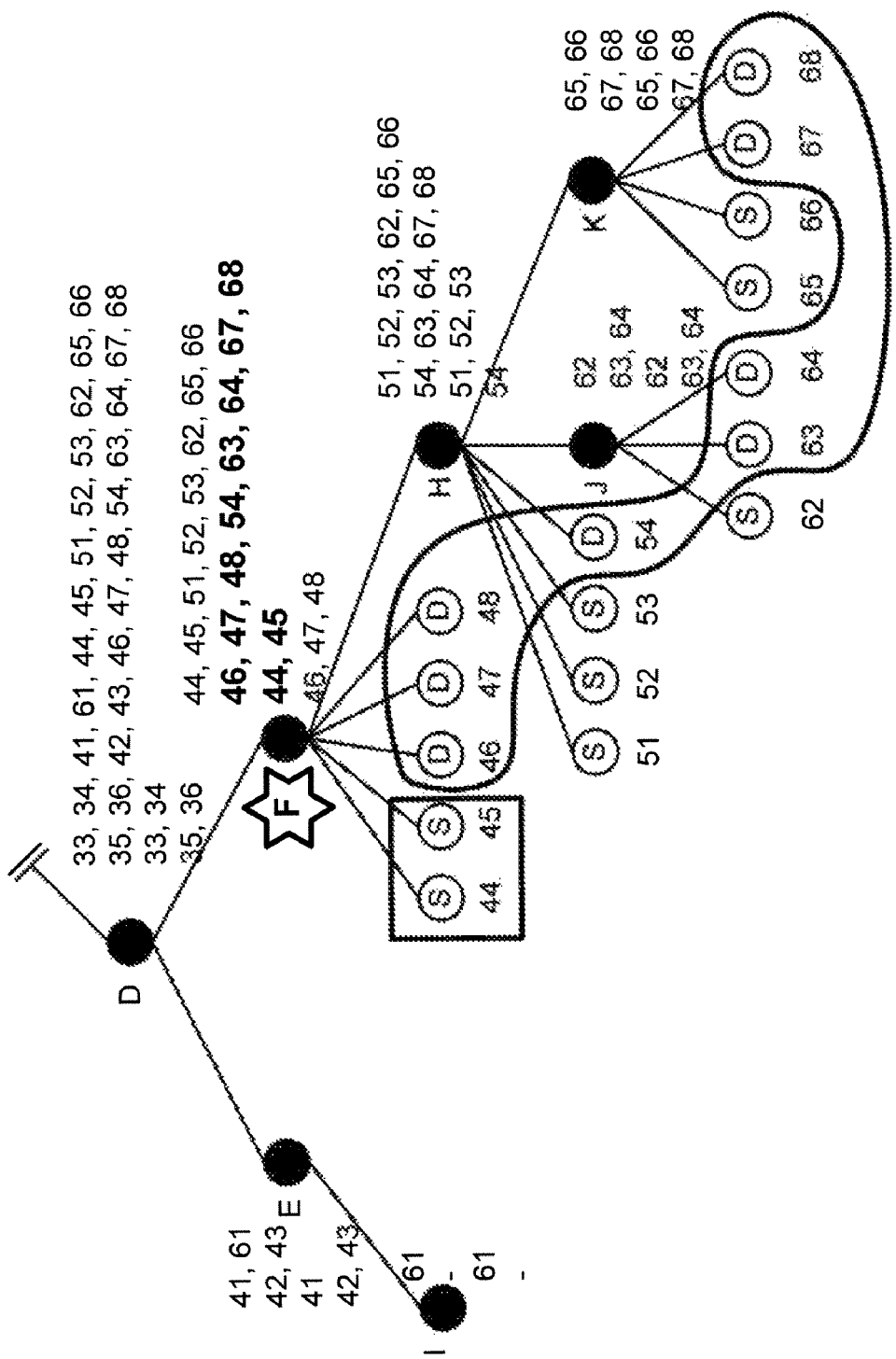
FIG. 8 shows the enumeration of the first CCPP group for a given node using linear enumeration in one embodiment.

In the linear enumeration method, two CCPP groups are identified per clock node, except for the root node where only one CCPP group is identified. It should be noted that one of the CCPP groups enumerated per node does not include the node being examined but its parent. The first CCPP group includes the node being examined, and the SRG and ADR of the node being examined. FIG. 8 shows the enumeration of the first CCPP group for a given node using linear enumeration in one embodiment. Node F is being examined, and the CCPP group enumerated consists of F, SRG(F)=registers 44-45, and ADR(F)=registers 46-48, 54, 63, 64, 67, and 68.

The second enumeration of the linear method defines a CCPP group that includes the parent of the node being examined, the ASR of the node being examined, and the nodes in ADR(parent) not present in ADR(node being examined). In other words, the destination registers in the CCPP group is the result of 'subtracting' from the ADR(parent) the nodes in the ADR(node being examined). Because the root node does not have a parent, only one enumeration is possible when examining the root node, but the root node will be included in the CCPP groups enumerated when examining root's children.

Figure 9:
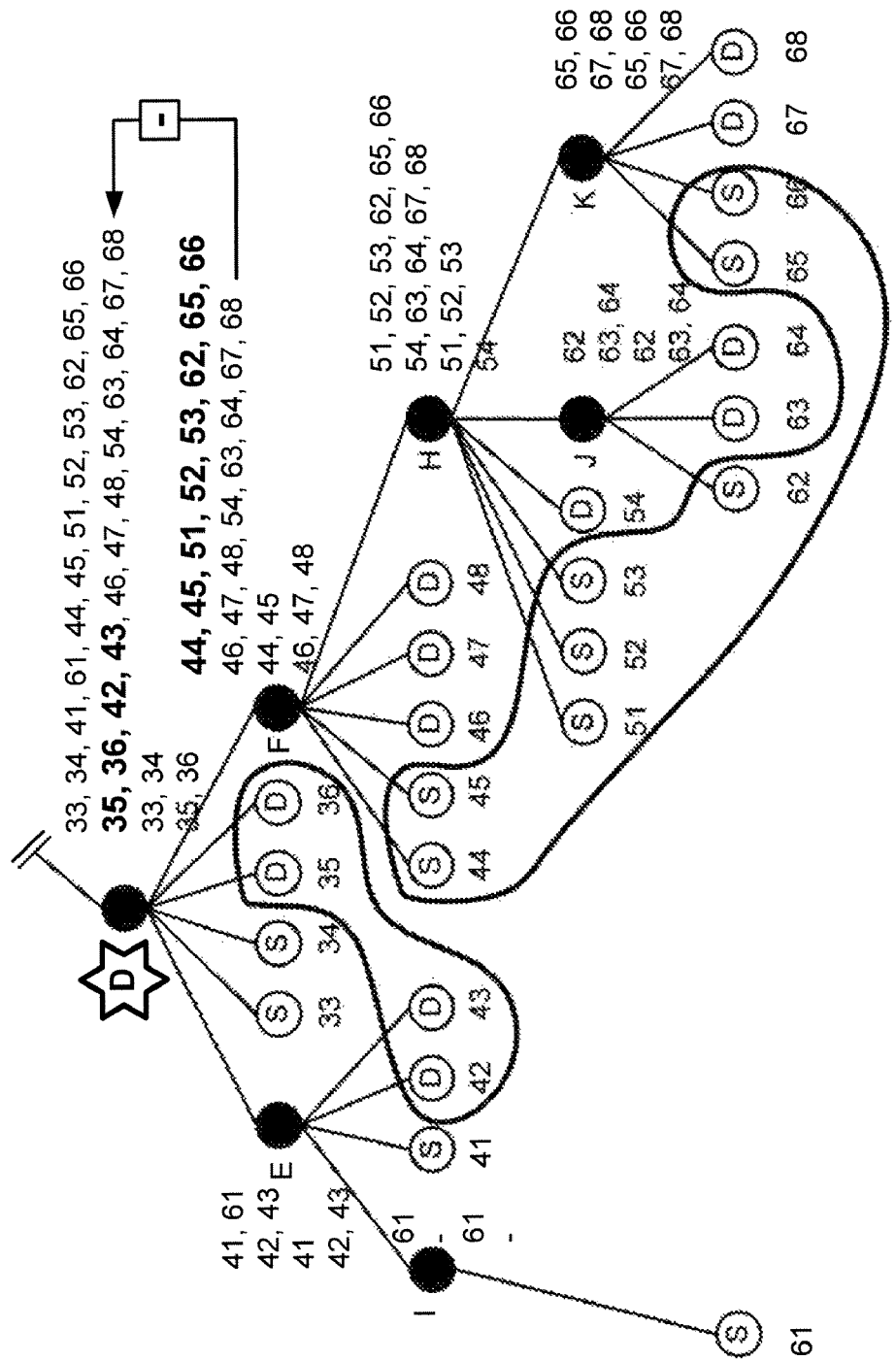
FIG. 9 depicts the enumeration of the second CCPP group for a given node using linear enumeration.

FIG. 9 depicts the enumeration of the second CCPP group for a given node using linear enumeration. Here, the node being examined is still F, thus the CCPP group includes its parent D. The source registers are ASR(F), that is 44, 45, 51-53, 62, 65, and 66. The destination registers is the difference between ADR(D) and ADR(F), that can be represented as:

CCPP.Destination registers=ADR(D)−ADR(F)=35, 36, 42, 43, 46-48, 54, 63, 64, 67, 68−46-48, 54, 63, 64, 67, 68=35, 36, 42, 43

This method can be described in pseudo-language, as follows:

```
//n.parent is the parent of node n
//Attributes of node n are: n.srg, n.asr, n.drg, n.adr, n.parent
For each node n in the tree {
  src_grp=n.srg
  dst_grp=n.adr
  print src_grp, dst_grp, n//first enumeration of n
  if n≠root then {
    src_grp=n.asr
    np=n.parent
    dst_grp=np.adr-n.adr
    print src_grp, dst_grp, np//second enumeration of n
  }
}
```

The number of CCPP groups is 2N−1, where N is the number of nodes in the tree. One is subtracted because the root node only produces one CCPP group. The execution time is in the O(N).

In one embodiment where the register groups are implemented with pointers and linked lists, the subtraction of register groups can be accomplished as follows:

```
//S1 and S2 are sets of registers represented in two-pointer form
S1==(s1_head, s1_tail)
S2==(s2_head, s2_tail)
//S2 is a subset of S1 and is contained as a contiguous linked list in S1
//S=S1−S2
//S is represented by 4 pointers (s1_head, s2_head, s2_tail, s1_tail)
//List elements in S
ptr=s1_head
while (ptr !=s2_head) {
  print ptr.obj
  ptr=ptr.next
}
while (ptr !=s2_tail) ptr=ptr.next//skip elements in S2
if (ptr !=s1_tail) ptr=ptr.next//go next unless S2 is the tail of S1
while (ptr !=s1_tail) {//print elements until s1_tail
  print ptr.obj
  ptr=ptr.next
}
if s1_tail!=s2_tail print s1_tail.obj//print last one unless S2 is at the end of S1
```

The key advantage of this implementation with pointers is that S can be obtained in linear time from S1 and S2.

Figure 10:
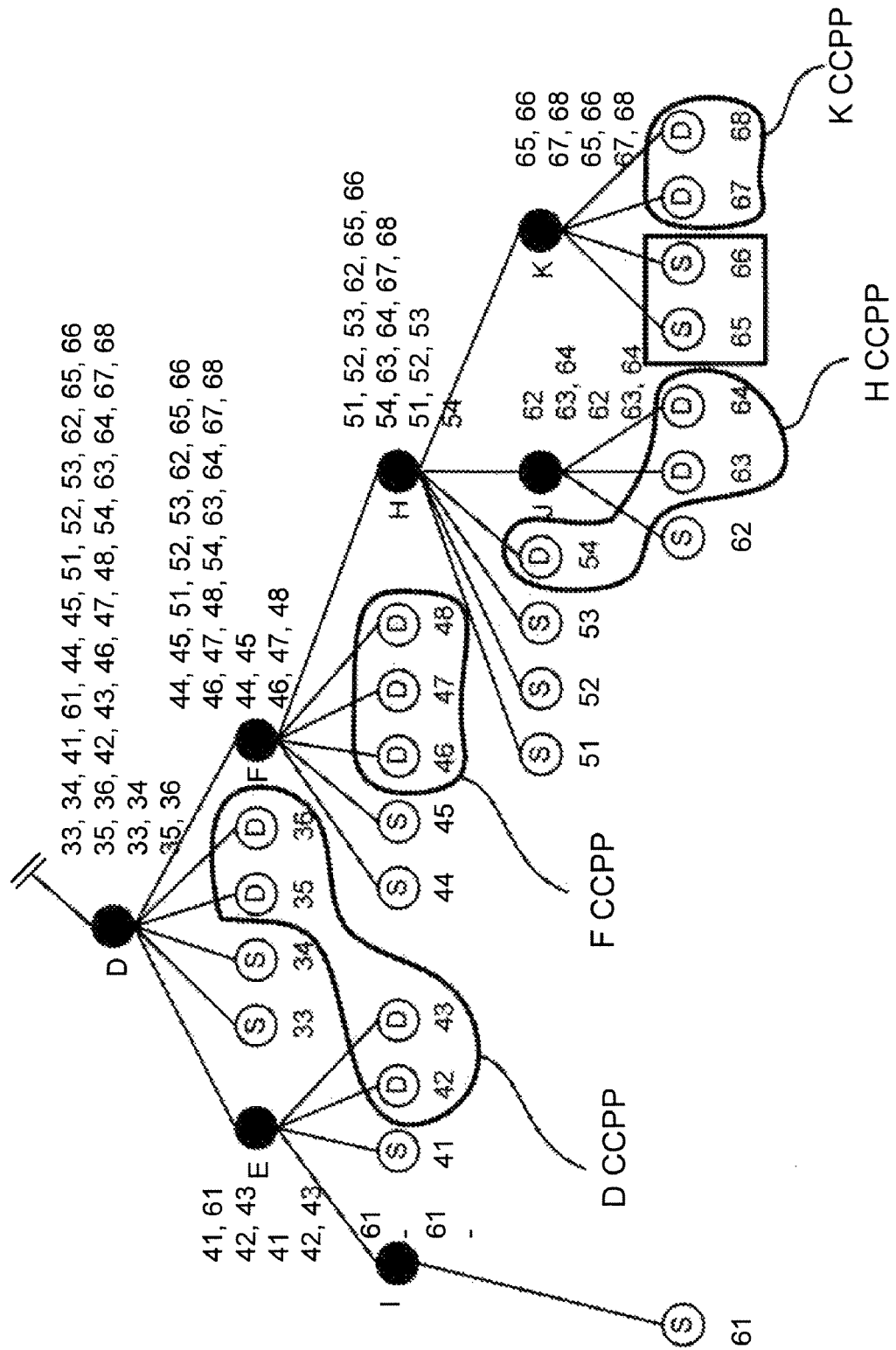
FIG. 10 shows the enumeration of CCPP groups using the N*LogN enumeration method.

The second method for enumerating CCPP groups is named N*LogN enumeration method. FIG. 10 shows the enumeration of CCPP groups using the N*LogN enumeration method. In this method, all the CCPP groups that contain the SRG of a given node are calculated in one pass. Given a node, the CCPP group containing the node, the SRG(node) and the ADR(node) is enumerated first. Then the routine "climbs" up the tree and enumerates a CCPP group for the parent of the current node, the SRG(original node), and the destination registers resulting from subtracting the ADR(parent of current node)−ADR(current node). The routine continues climbing and enumerating groups until reaching the root node. The method can be described in pseudo-language as follows:

```
//Attributes on a node n: n.srg, n.asr, n.drg, n.adr.
foreach node n in the tree {
  print n.srg, n.adr, n
  src_grp=n.srg
  let x=n
  while (x.parent !=NULL) {
    dst_grp=x.parent.adr−x.adr
    print src_grp, dst_grp, x.parent
    x=x.parent
  }
}
```

Each srg of a node n is included in as many CCPP groups, as there are nodes in the path from node n to the root. If we call the number of groups L (for level in the tree), the number of clock nodes in the tree N, and the tree is a k-ary tree, the maximum number of groups for a node is $Max(L)=\log_k(N)$. Since N nodes are being examined, the total number of groups is then less than $N*Log_k(N)$. The execution time of this method is in the order of $O(N*Log(N))$.

The embodiments previously described can easily be expanded to incorporate analysis for rise and fall delays of the clock signal. Two arrival times on each clock node are calculated instead of just one, one for the rising clock arrival time, and one for the falling clock arrival time. Additionally, source and destination registers are divided into two groups: rising source or destination register groups whose registers have active rising clock edges, and falling source or destination register groups whose registers have active falling clock edges. Therefore, the number of CCPP groups accounting for rise and fall delays will be up to four times the number of original CCPP groups for just rising clock signals.

Figure 11:
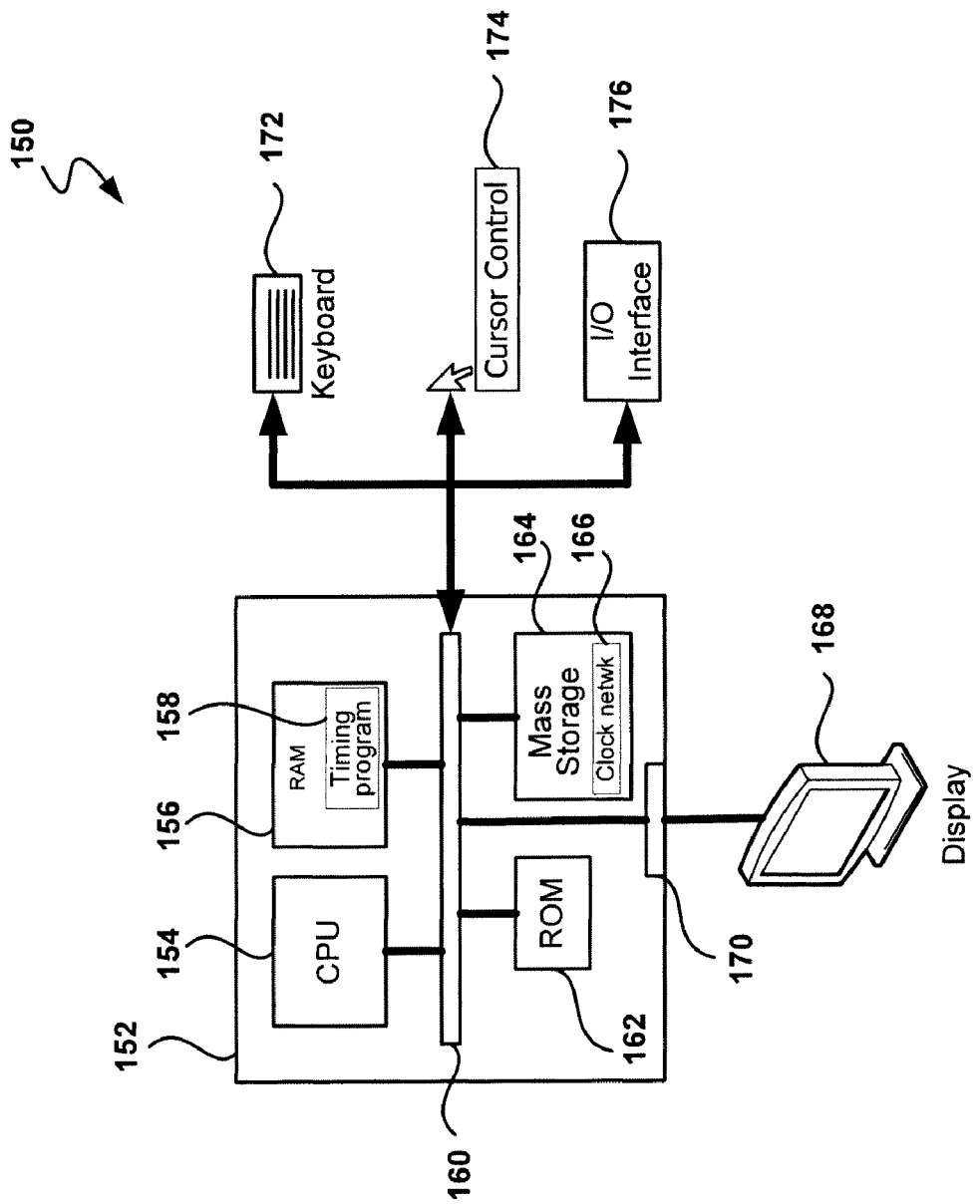
FIG. 11 is a simplified schematic diagram of a computer system for implementing embodiments of the present invention.

FIG. 11 is a simplified schematic diagram of a computer system for implementing embodiments of the present invention. It should be appreciated that the methods described herein may be performed with a digital processing system, such as a conventional, general-purpose computer system. Special purpose computers, which are designed or programmed to perform only one function may be used in the alternative. In addition, the computer system of FIG. 11 may be used to perform synthesis and timing analysis of a design that is described in a hardware description language. The computer system includes a central processing unit (CPU) 154, which is coupled through bus 160 to random access memory (RAM) 156, read-only memory (ROM) 162, and mass storage device 164. Timing program 158 resides in random access memory (RAM) 156. Timing program 158 may contain software that when executed by CPU 154 will cause CPU 154 to execute the functionality of FIGS. 2-10.

Mass storage device 164 represents a persistent data storage device such as a floppy disc drive or a fixed disc drive, which may be local or remote. Clock network information 166 resides in mass storage device 164. It should be appreciated that CPU 154 may be embodied in a general-purpose processor, a special purpose processor, or a specially programmed logic device. Display 168 is in communication with CPU 154, RAM 156, ROM 162, and mass storage device 164, through bus 160 and display interface 170. Of course, display 168 is configured to display the user interfaces described herein. Keyboard 172, cursor control 174, and input/output interface 176 are coupled to bus 160 in order to communicate information in command selections to CPU 154. It should be appreciated that data to and from external devices may be communicated through input output interface 176.

Embodiments of the present invention may be practiced with various computer system configurations including handheld devices, microprocessor systems, microprocessor-based or programmable consumer electronics, minicomputers, mainframe computers and the like. The invention can also be practiced in distributed computing environments where tasks are performed by remote processing devices that are linked through a wire-based or wireless network.

With the above embodiments in mind, it should be understood that the invention can employ various computer-implemented operations involving data stored in computer systems. These operations are those requiring physical manipulation of physical quantities. Usually, though not necessarily, these quantities take the form of electrical or magnetic signals capable of being stored, transferred, combined, compared and otherwise manipulated.

Any of the operations described herein that form part of the invention are useful machine operations. The invention also relates to a device or an apparatus for performing these operations. The apparatus can be specially constructed for the required purpose, or the apparatus can be a general-purpose computer selectively activated or configured by a computer program stored in the computer. In particular, various general-purpose machines can be used with computer programs written in accordance with the teachings herein, or it may be more convenient to construct a more specialized apparatus to perform the required operations.

The invention can also be embodied as computer readable code on a computer readable medium. The computer readable medium is any data storage device that can store data, which can be thereafter be read by a computer system. Examples of the computer readable medium include hard drives, network attached storage (NAS), read-only memory, random-access memory, CD-ROMs, CD-Rs, CD-RWs, magnetic tapes and other optical and non-optical data storage devices. The computer readable medium can also be distributed over a network-coupled computer system so that the computer readable code is stored and executed in a distributed fashion.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method to perform timing analysis of a design containing clock networks, the method comprising:
    transforming a clock network into a clock tree;
    populating the clock tree with information regarding source and destination registers in the design;
    enumerating a Common Clock Path Pessimism (CCPP) group for nodes in the clock tree, the CCPP group of any of the nodes including all source registers that are direct children of the node and all destination registers that are descendants of the node in the clock tree, wherein any source register and any destination register in a CCPP group have a same nearest common ancestor node in the clock tree;
    eliminating CCPP using the enumerated CCPP groups; and
    outputting the timing analysis results, wherein each operation of the method is executed by a processor.

2. The method as recited in claim 1, wherein transforming a clock network further includes,
    designating a root clock node in the clock tree as the clock timing origin;
    representing registers as leaf nodes in the clock tree; and
    creating clock nodes as non-leaf nodes in the clock tree, wherein all immediate children registers and immediate children clock nodes of a clock node have a common clock signal arrival time,
    wherein the arrival time to a leaf or clock node is the delay of the clock signal between the root node and the leaf or clock node.

3. The method as recited in claim 2, wherein transforming a clock network further includes,
    identifying a source register group (SRG) of a clock node as a set of all immediate children of the clock node that are source registers; and
    identifying a destination register group (DRG) of a clock node as a set of all immediate children of the clock node that are destination registers.

4. The method as recited in claim 3, wherein identifying the SRG and the DRG of the clock node further includes,
    identifying a parent clock node of a register;
    adding the register to the parent clock node SRG when the register is a source register; and
    adding the register to the parent clock node DRG when the register is a destination register.

5. The method as recited in claim 3, wherein transforming a clock network further includes,
    computing arrival times from the root clock node to all leaf and clock nodes.

6. The method as recited in claim 3, wherein transforming a clock network further includes,
    replacing an empty clock node with the children of the empty clock node, the empty clock node having empty SRG and DRG.

7. The method as recited in claim 3, wherein transforming a clock network further includes,
    replacing a register feeding back to itself with a new clock node, the new clock node having two children, the two children being a replacement source register and a replacement destination register,
    making the arrival times for the new clock node and its two children equal to the arrival time of the register feeding back to itself.

8. The method as recited in claim 3, wherein populating the clock tree further includes,
    identifying all source registers (ASR) of a given clock node by adding the SRG of the given clock node to the ASRs of all the clock nodes that are children of the given clock node; and
    identifying all destination registers (ADR) of a given clock node by adding the DRG of the given clock node to the ADRs of all the clock nodes that are children of the given clock node.

9. The method as recited in claim 8, wherein enumerating CCPP groups further includes,
    enumerating a first CCPP group that includes the given clock node, the SRG of the given clock node, and the ADR of the given clock node; and
    enumerating a second CCPP group that includes the parent of the given clock node, the ASR of the given clock node, and all registers in the ADR of the given clock node parent not present in the ADR of the given clock node.

10. The method as recited in claim 8, wherein enumerating CCPP groups further includes enumerating all the CCPP groups that include the SRG of a given clock node, the enumerating all the CCPP groups including,
    enumerating a first CCPP group that includes the given clock node, the SRG of the given clock node, and the ADR of the given clock node;
    assigning a variable clock node the value of the given clock node; and
    while there is a parent for the variable clock node enumerate a new CCPP group that includes the parent of the variable clock node, the SRG of the given clock node, and all registers in the ADR of the parent of the variable clock node not present in the ADR of the variable clock node, and then assigning the variable clock node the value of the parent of the variable clock node.

11. The method as recited in claim 1, wherein eliminating CCPP further comprises,
   eliminating pessimism by calculating timing delays using the timing information associated with the CCPP groups.

12. The method as recited in claim 1, wherein outputting the timing analysis results further comprises at least one of,
   reporting a panel of CCPP groups,
   reporting slack in the design,
   reporting the maximum frequency for the design,
   reporting which registers exceed a predetermined maximum delay permissible,
   reporting minimum delay for all registers, or
   reporting maximum delay for all registers.

13. A method to perform timing analysis of a design containing clock networks, the method comprising:
   transforming a clock network into a clock tree;
   populating the clock tree with information regarding source and destination registers in the design;
   enumerating a Common Clock Path Pessimism (CCPP) groups, wherein any source register and any destination register in a CCPP group have a same nearest common ancestor node in the clock tree;
   eliminating CCPP using the enumerated CCPP groups;
   outputting the timing analysis results; and
   performing the timing analysis for rising arrival clock times and falling arrival clock times and for different combinations of rising source registers, rising destination registers, falling source registers, and falling destination registers, wherein each operation of the method is executed by a processor.

14. A computer program embedded in a non-transitory computer-readable storage medium, when executed by one or more processors, for performing timing analysis of designs containing clock networks by incorporating Common Clock Path Pessimism, the computer program comprising:
   computer code for transforming a clock network into a clock tree;
   computer code for populating the clock tree with information regarding source and destination registers in the design;
   computer code for enumerating a CCPP group for nodes in the clock tree, the CCPP group of any of the nodes including all source registers that are direct children of the node and all destination registers that are descendants of the node in the clock tree, wherein any source register and any destination register in a CCPP group have a same nearest common ancestor node in the clock tree;
   computer code for eliminating CCPP using the enumerated CCPP groups; and
   computer code for outputting the timing analysis results.

15. The computer program as recited in claim 14, wherein transforming a clock network further includes,
   computer code for designating a root clock node in the clock tree as the clock timing origin;
   computer code for representing registers as leaf nodes in the clock tree; and
   computer code for creating clock nodes as non-leaf nodes in the clock tree,
   wherein all immediate children registers and immediate children clock nodes of a clock node have a common clock signal arrival time,
   wherein the arrival time to a leaf or clock node is the delay of the clock signal between the root node and the leaf or clock node.

16. The computer program as recited in claim 15, wherein transforming a clock network further includes,
   computer code for identifying a source register group (SRG) of a clock node as a set of all immediate children of the clock node that are source registers; and
   computer code for identifying a destination register group (DRG) of a clock node as a set of all immediate children of the clock node that are destination registers.

17. The computer program as recited in claim 16, wherein the SRG of a clock node is stored in a SRG linked list of register nodes,
   wherein the ASR of a clock node is stored in an ASR linked list of register nodes, the ASR linked list of register nodes including a head pointer and a tail pointer,
   wherein populating the clock tree further includes computer code for invoking a recursive visit routine that embeds the linked SRG links lists of children nodes inside the ASR linked lists.

18. A system to perform timing analysis of designs containing clock networks by incorporating Common Clock Path Pessimism, the system comprising:
   a computer device having a processor;
   a display to show results of the timing analysis; and
   a memory, the memory including,
   a model of the design, and
   a timing analysis program,
   wherein the program instructions from the timing analysis program when executed by the processor cause the processor to,
   transform a clock network into a clock tree;
   populate the clock tree with information regarding source and destination registers in the design;
   enumerate a CCPP group for nodes in the clock tree, the CCPP group of any of the nodes including all source registers that are direct children of the node and all destination registers that are descendants of the node in the clock tree, wherein any source register and any destination register in a CCPP group have a same nearest common ancestor node in the clock tree;
   eliminate CCPP using the enumerated CCPP groups; and
   output the timing analysis results.

19. The system as recited in claim 18, wherein the nearest common ancestor of a source register and a destination register is an ancestor of the source and destination registers, wherein no descendant of the nearest common ancestor is also an ancestor of both the source and destination registers.

20. The system as recited in claim 18,
   wherein the source registers have at least one timing path to another register,
   wherein the destination registers have at least one timing path from another register.

* * * * *